United States Patent
He et al.

(10) Patent No.: US 10,013,753 B2
(45) Date of Patent: Jul. 3, 2018

(54) METHOD FOR EVALUATING BANDGAP DISTRIBUTIONS OF NANOWIRES

(71) Applicants: Tsinghua University, Beijing (CN); HON HAI PRECISION INDUSTRY CO., LTD., New Taipei (TW)

(72) Inventors: Yu-Jun He, Beijing (CN); Dong-Qi Li, Beijing (CN); Jin Zhang, Beijing (CN); Li-Na Zhang, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 108 days.

(21) Appl. No.: 14/511,166

(22) Filed: Oct. 9, 2014

(65) Prior Publication Data

US 2015/0104095 A1 Apr. 16, 2015

(30) Foreign Application Priority Data

Oct. 10, 2013 (CN) .......................... 2013 1 0469579

(51) Int. Cl.
*G06T 7/00* (2017.01)
*H01L 21/66* (2006.01)

(52) U.S. Cl.
CPC ............ *G06T 7/0006* (2013.01); *H01L 22/12* (2013.01); *G06T 2207/10061* (2013.01); *G06T 2207/30148* (2013.01)

(58) Field of Classification Search
None
See application file for complete search history.

(56) References Cited

U.S. PATENT DOCUMENTS

| 2005/0151126 | A1 | 7/2005 | Yamakawa et al. |
| 2006/0269688 | A1 | 11/2006 | Sadewasser et al. |

FOREIGN PATENT DOCUMENTS

TW 200525054 8/2005

OTHER PUBLICATIONS

Duan, Xiangfeng, et al. "Indium phosphide nanowires as building blocks for nanoscale electronic and optoelectronic devices." Nature 409.6816 (2001): 66-69.*
Qian, Peng, et al. "Electrochemical identification of metallic and semiconducting single-walled carbon nanotubes." The Journal of Physical Chemistry C 112.35 (2008): 13346-13348.*
Li J, He Y, Han Y, Liu K, Wang J, Li Q, Fan S, Jiang K. Direct identification of metallic and semiconducting single-walled carbon nanotubes in scanning electron microscopy. Nano letters. Jul. 3, 2012;12(8):4095-101.*

(Continued)

*Primary Examiner* — Vu Le
*Assistant Examiner* — Tracy Mangialaschi
(74) *Attorney, Agent, or Firm* — ScienBiziP, P.C.

(57) ABSTRACT

A method for evaluating bandgap distributions of nanowires is provided. First, a plurality of nanowires located on a surface of a substrate is provided. Second, a metal electrode on the surface and electrically connected to the plurality of nanowires is provided. Third, a SEM image is taken on the plurality of nanowires and the metal electrode. Fourth, the bandgap distributions of the plurality of nanowires are evaluated through the SEM image.

19 Claims, 8 Drawing Sheets

(56) References Cited

OTHER PUBLICATIONS

Jin, Zhong, et al. "Ultralow feeding gas flow guiding growth of large-scale horizontally aligned single-walled carbon nanotube arrays." Nano letters 7.7 (2007): 2073-2079.*
Manheller, Marcel, et al. "Reliable fabrication of 3 nm gaps between nanoelectrodes by electron-beam lithography." Nanotechnology 23.12 (2012): 125302.*
Liu, Zhongfan, et al. "Aligned, Ultralong Single-Walled Carbon Nanotubes: From Synthesis, Sorting, to Electronic Devices." Advanced materials 22.21 (2010): 2285-2310.*
Perea, Daniel E., et al. "Controlling heterojunction abruptness in VLS-grown semiconductor nanowires via in situ catalyst alloying." Nano letters 11.8 (2011): 3117-3122.*
Lee Jie,Controlled Synthesis and Identification of Single-walled Carbon Nanotubes on Quartz,Master's degree thesis of Tsinghua University,May 2012,pp. 27-29 and 62-74,CNKI,China.
Peng Qian et al.,Electrochemical Identification of Metallic and Semiconducting Single-Walled Carbon Nanotubes,The Journal of Physical Chemistry C Letters,Jul. 9, 2008,pp. 13346-13348,112-35,Americn Chemical Society.

* cited by examiner

METHOD FOR EVALUATING BANDGAP DISTRIBUTIONS OF NANOWIRES

RELATED APPLICATIONS

This application claims all benefits accruing under 35 U.S.C. § 119 from China Patent Application No. 201310469579.1, filed on Oct. 10, 2013 in the China Intellectual Property Office, entire contents of which is hereby incorporated by reference. The disclosures of the above-identified applications are incorporated herein by reference.

FIELD

The disclosure generally relates to method for evaluating property of nanowires, and particularly, to a method for evaluating bandgap distributions of nanowires.

BACKGROUND

Nanowires, such as silicon nanowires, silica nanowires, zinc oxide nanowires, carbon nanotubes, etc., with quasi one-dimensional structure and unique electrical properties, are widely applied to electronic devices, field emission technology, biological medicine, hydrogen storage technology, and many other fields of research work.

As one of nanowires, semiconducting single-walled carbon nanotube (s-SWCNT) is a promising material for next generation electronic and optoelectronic devices, due to its excellent properties such as high mobility and ballistic transport of charge carriers, high ON/OFF ratio, and direct bandgap electronic structure etc. These properties are primarily determined by s-SWCNT's bandgap and the Schottky barrier formed at the metal-SWCNT contact. Therefore the precise control of the bandgap and Schottky barrier, is the greatest challenge for real device applications. In order to obtain SWCNTs with narrow bandgap distribution for device applications, it is important to develop an efficient and effective method for evaluating the bandgap distribution What is needed, therefore, is a method for evaluating the bandgap distribution of nanowires.

BRIEF DESCRIPTION OF THE DRAWINGS

Many aspects of the present membrane electrode assembly and fuel cell using the same can be better understood with references to the following drawings. The components in the drawings are not necessarily drawn to scale, the emphasis instead being placed upon clearly illustrating the principles of the present membrane electrode assembly and fuel cell using the same.

Figure 1:
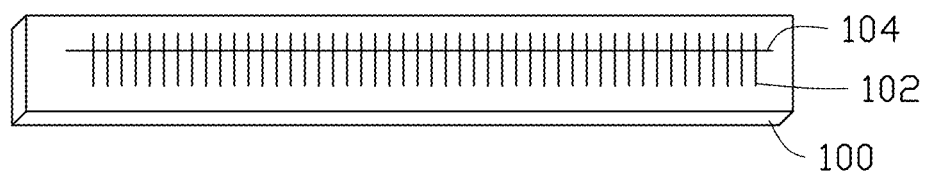
FIG. 1 is a schematic view of nanowires connected to a metal electrode in a method for evaluating bandgap distributions of the nanowires in accordance with one embodiment.

Corresponding reference characters indicate corresponding parts throughout the several views. The exemplifications set out herein illustrate at least one present embodiment of the membrane electrode assembly and fuel cell using the same, in at least one form, and such exemplifications are not to be construed as limiting the scope of the disclosure in any manner.

DETAILED DESCRIPTION

References will now be made to the drawings, in detail, to describe embodiments of the membrane electrode assembly and fuel cell using the same.

Referring to FIG. 1, a method for evaluating bandgap distributions of nanowires is provided according to an embodiment. The method includes the steps of:

S1, providing a plurality of nanowires 102 located on a surface of a substrate 100;

S2, providing a metal electrode 104 on the surface and electrically connected to the plurality of nanowires 102;

S3, taking a SEM image on the plurality of nanowires 102 and the metal electrode 104;

S4, evaluating the bandgap distributions of the nanowires 102 through the SEM image.

In step S1, the substrate 100 can be made of silicon, silica, or quartz. A thickness and area of the substrate 100 are not limited, as an SEM image can be obtained. The plurality of nanowires 102 can be silicon nanowires, silica nanowires, zinc oxide nanowires, carbon nanotubes, molybdenum disulfide, or graphene nanoribbons. At least one of the plurality of nanowires 102 is semiconducting nanowire. In one embodiment, the plurality of nanowires 102 extends along a same direction, and is spaced with each other. The plurality of nanowires 102 can grow on the surface of the substrate 100, or transfer from another substrate. In one embodiment, the substrate 100 has a planar surface; the plurality of nanowires 102 is parallel and spaced located on the planar surface.

In one embodiment, the plurality of nanowires 102 is SWCNTs. The SWCNTs can be s-SWCNTs or include parts of m-SWCNTs. At least parts of the SWCNTs are s-SWCNTs. The m-SWCNTs of the SWCNTs have no influence on the result of the evaluation of the bandgap distributions of the nanowires 102.

In one embodiment, the SWCNTs are synthesized on a quartz substrate via chemical vapor deposition (CVD). The method for synthesizing the SWCNTs comprises the steps of:

S11, providing a ST-cut quartz substrate;

S12, dispersing a iron catalyst layer on a surface of the ST-cut quartz substrate;

S13, locating the ST-cut quartz substrate in a quartz tube; and

S14, introducing methane and hydrogen into the quartz tube at 800 centigrade degrees to 950 centigrade degrees for about 10 minutes to about 20 minutes.

Figure 2:
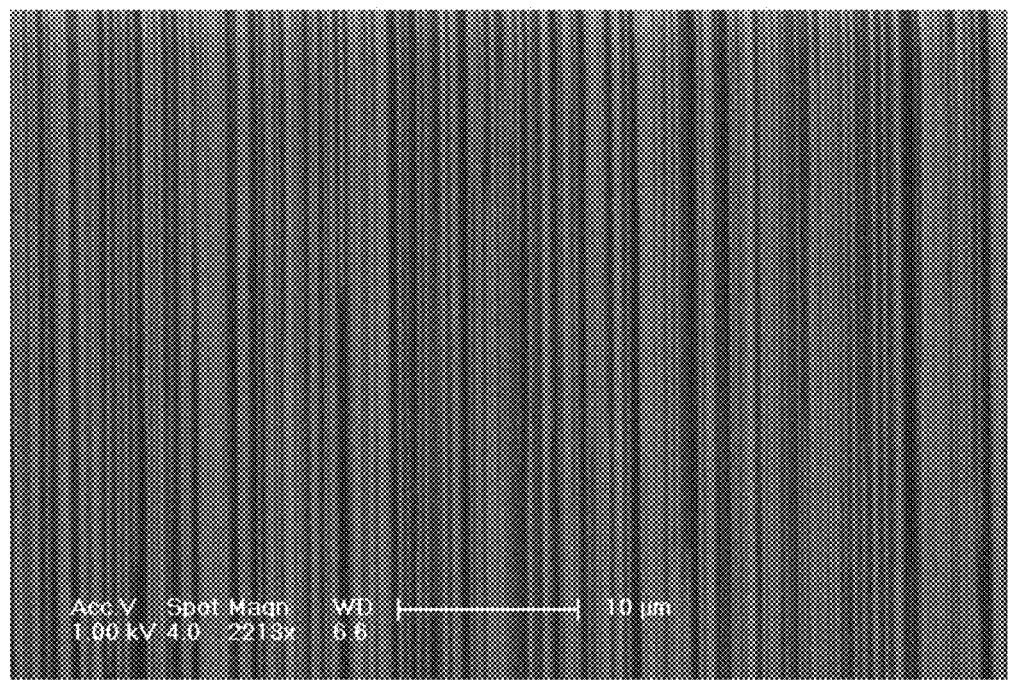
FIG. 2 is a Scanning Electron Microscope (SEM) image of a plurality of SWCNTs in accordance with one embodiment.

Referring to FIG. 2, the SWCNTs obtained by above method are spaced from and parallel to each other. The SWCNTs have a same length about 100 microns. A distance between the adjacent parallel SWCNTs is about 200 nanometers to about 1000 nanometers. The SWCNTs on the ST-cut quartz substrate can be transferred onto a $SiO_2/Si$ substrate.

In step S2, a material of the metal electrode 104 is not limited, so long as Schottky barrier can be formed between the nanowires 102 and the metal electrode 104 when the nanowires 102 contact the metal electrode 104. The material of the metal electrode 104 can be titanium, palladium, gold, chromium, aluminum or scandium. A shape and width of the metal electrode 104 are unlimited, as long as each one of the nanowires 102 can contact with the metal electrode 104. In one embodiment, the metal electrode 104 is bar shape and made of titanium. In one embodiment, the metal electrode 104 is made by a electron beam lithography method, the method comprises the steps of:

S21, locating a first resist layer on the surface of the substrate 100;

S22, locating a second resist layer on the first resist layer;

S23, forming a required pattern by electron beam lithography; and

S25, removing the maintained resist material.

Figure 3:
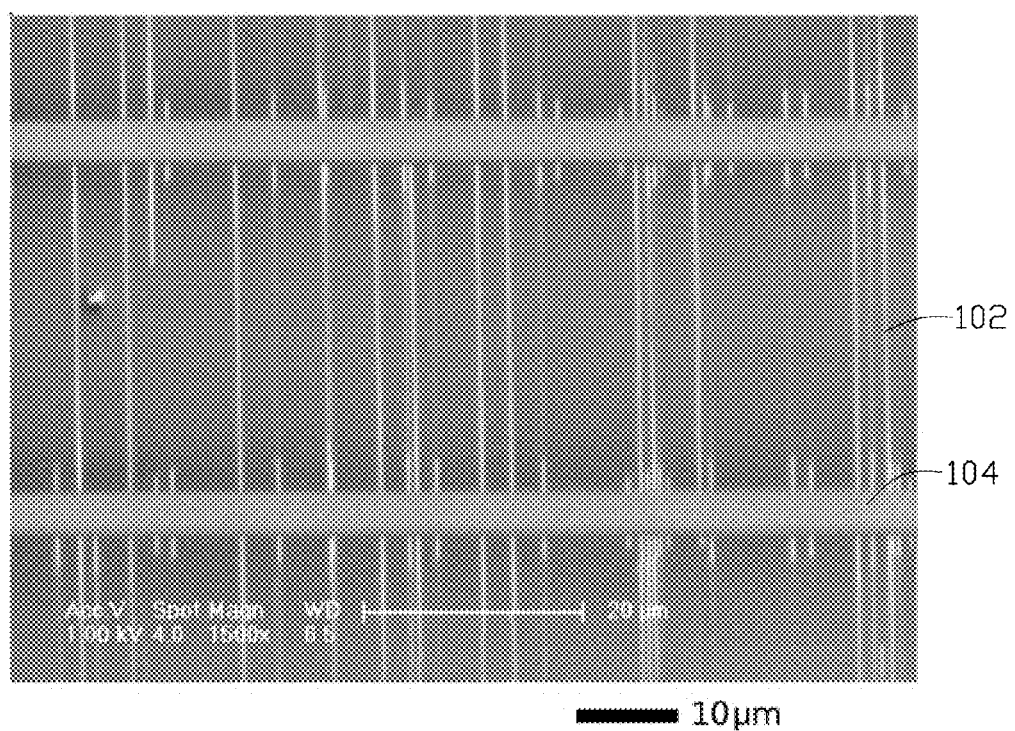
FIG. 3 is a SEM image of a plurality of SWCNTs connected to two metal electrodes in accordance with one embodiment.

The first resist layer is made of methyl methacrylate (MMA). The second resist layer is made of polymethyl methacrylate (PMMA). Referring to FIG. 3, in one embodiment, two parallel metal electrodes 104 intersect and contact the plurality of parallel nanowires 102. The two metal electrodes 104 are perpendicular the plurality of parallel nanowires 102.

In step S3, the SEM image is taken on the plurality of nanowires 102 and the metal electrode 104 on the substrate 100 by a SEM device. Referring to FIG. 3, a plurality of bright segments exists at the contact area between the metal electrode 104 and the plurality of nanowires 102. The plurality of bright segments is according to the plurality of nanowires 102. Each of the plurality of bright segments extends along a corresponding nanowire 102. In FIG. 3, in one embodiment, the plurality of nanowires 102 is SWCNTs. When the length of the bright segment is same as the length of the corresponding SWCNT, the corresponding SWCNT is metallic. When the length of the bright segment is not same as the length of the corresponding SWCNT, the corresponding SWCNT is semiconducting. In other words, if the bright segment is a continuous bright line, the corresponding SWCNT is metallic. On the contrary, the corresponding SWCNT is semiconducting. Therefore, the semiconducting and metallic SWCNTs can be directly differentiated in the SEM image shown in FIG. 3.

Figure 4:
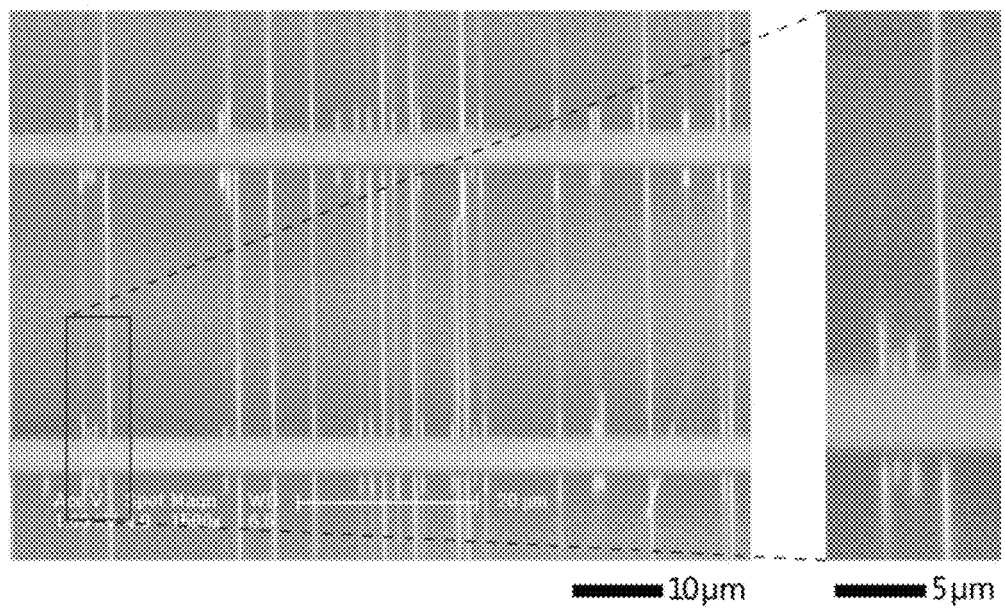
FIG. 4 is an amplified SEM image of three s-SWCNTs and one metal-SWCNT (m-SWCNT).
Figure 5:
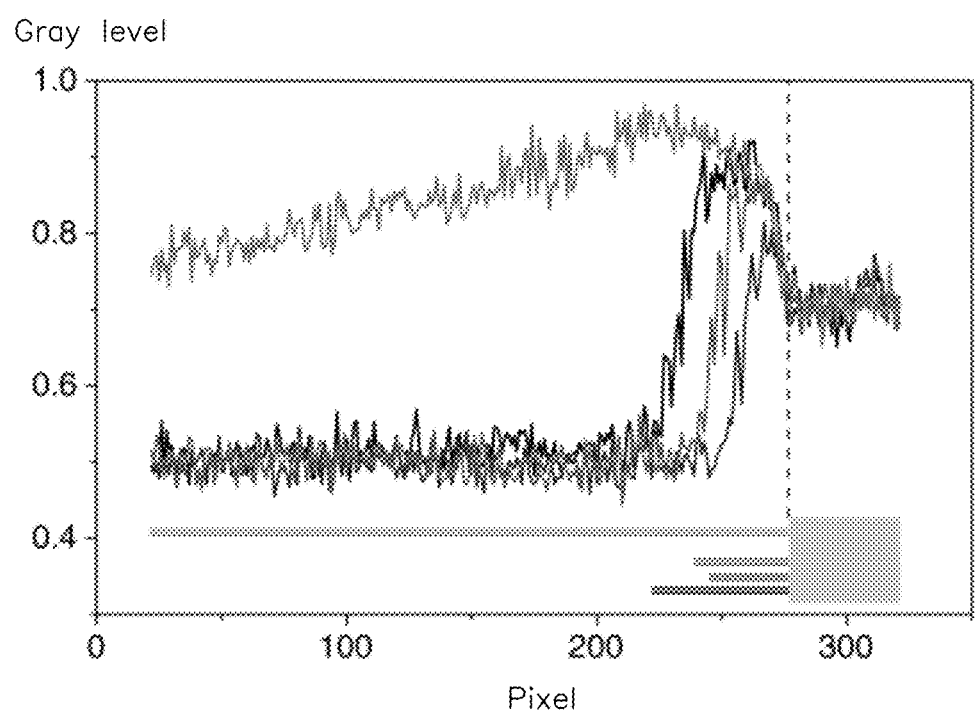
FIG. 5 is grayscale curves of the three S-SWCNTs and the one m-SWCNT in FIG. 4.
Figure 6:
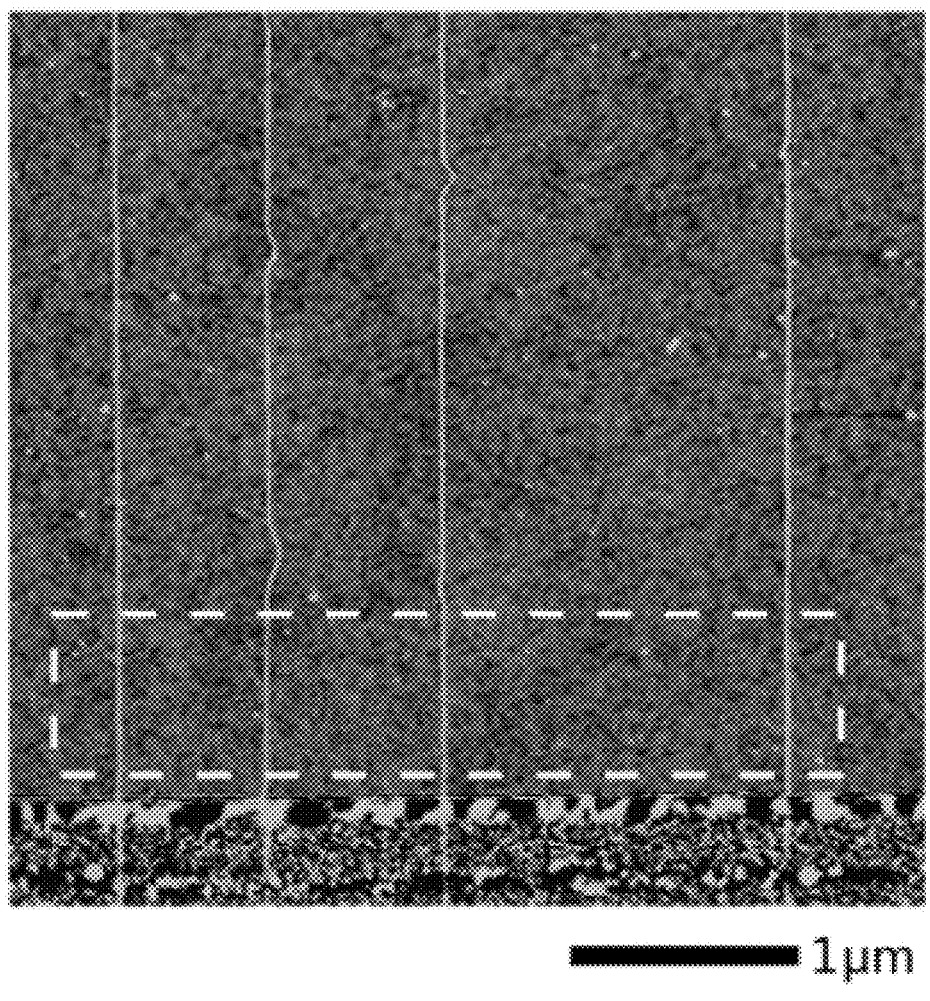
FIG. 6 is an Atomic Force Microscope (AFM) image of the three s-SWCNTs and the one m-SWCNT in FIG. 4.
Figure 7:
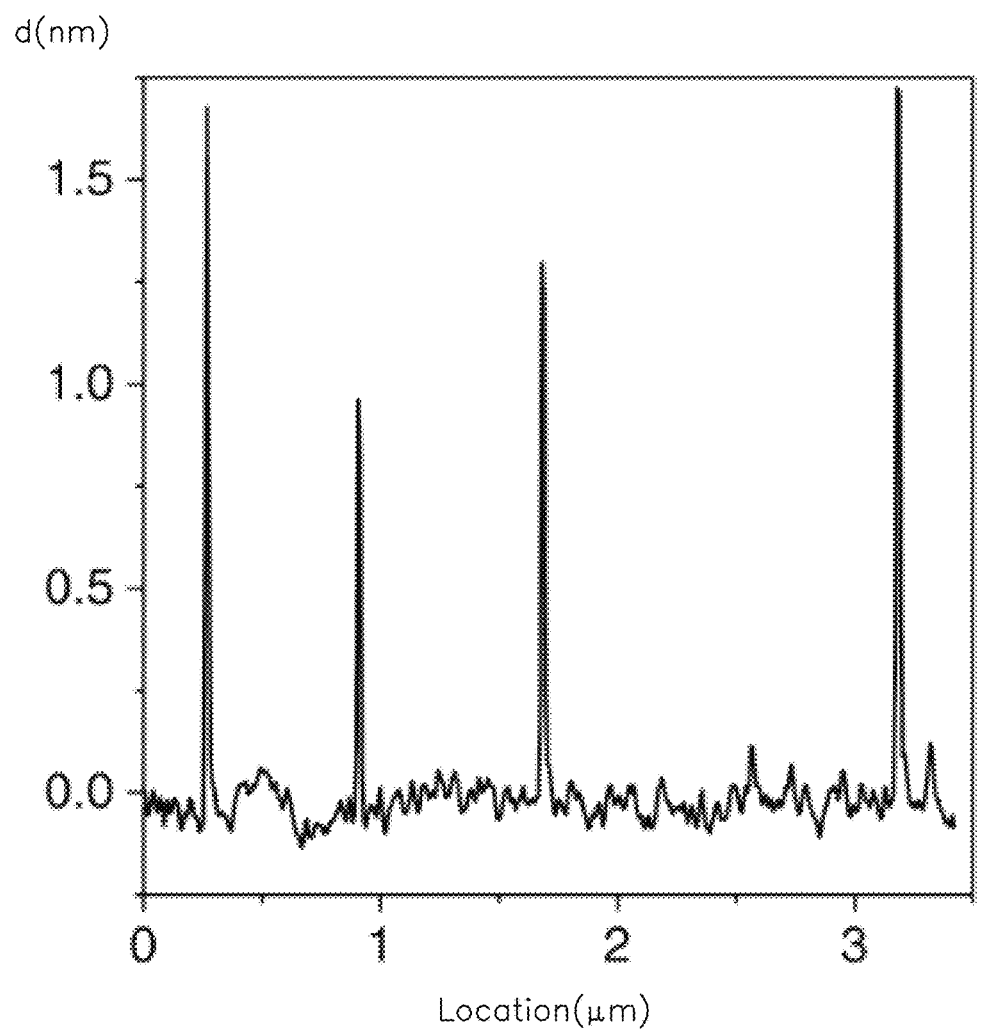
FIG. 7 is a view of a relationship of the diameter of the three s-SWCNTs and the one m-SWCNT in FIG. 4.
Figure 8:
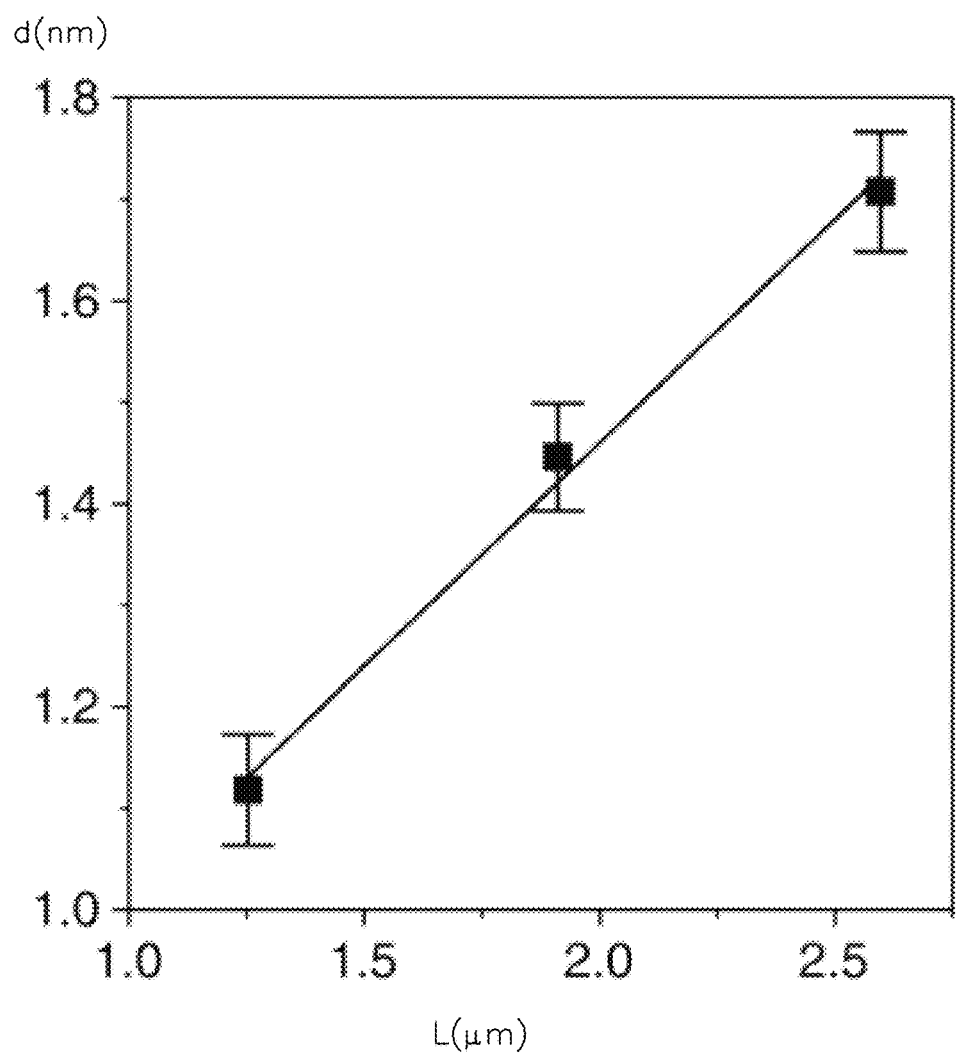
FIG. 8 is a view of a linear relationship between length of bright segment ($L_{BS}$) and the diameter of the three s-SWCNTs in FIG. 4.

In step S4, in one embodiment, to evaluate the bandgap distribution of the SWNTs shown in FIG. 3, a length of the bright segment according to the corresponding SWNT is defined as $L_{BS}$. The $L_{BS}$ can be measured by any method in the art, such as being measured by a ruler, or measured by a computer. Referring to FIG. 4, as an example, four SWCNTs are selected, three of the four SWCNTs are semiconducting SWCNTs, one of the four SWCNTs is metallic SWCNT. In FIG. 5, grayscale curves of the four SWCNTs in FIG. 4 are shown. The $L_{BS}$ of each of the three s-SWCNTs can be read in FIG. 5, and is respectively 1.25 micron, 1.91 micron, and 2.6 micron. Referring to FIG. 6, the AFM image of the three s-SWCNTs and the one m-SWCNT is shown. Referring to FIG. 7, the relationship of the diameters (d) of the three s-SWCNTs is shown, and the diameters (d) of the three s-SWCNTs is respectively 1.12 nanometer, 1.45 nanometer, 1.71 nanometer. Referring to FIG. 8, a linear relationship between the $L_{BS}$ and the diameters (d) of s-SWCNTs is shown, and the $L_{BS}$ of the s-SWCNT is proportional to the diameter (d) of the s-SWCNT.

Because the band gap ($E_g$) of the s-SWCNTs is inversely proportional to the diameter (d) of the s-SWCNTs. It is concluded that the band gap ($E_g$) of the s-SWCNT is inversely proportional to the $L_{BS}$ of the s-SWCNT. Therefore, in step S4, via the SEM image of the nanowires 102 connected to the metal electrode 104, the badgap distributions of the nanowires 102 can be obtained by contrasting the $L_{BS}$ of each of the nanowires 102.

Finally, it is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

It is also to be understood that the above description and the claims drawn to a method may comprise some indication in reference to certain steps. However, the indication used is only to be viewed for identification purposes and not as a suggestion as to an order for the steps.

What is claimed is:

1. A method for evaluating bandgap distributions of nanowires, comprising:
    S1, providing a plurality of nanowires located on a surface of a substrate, wherein the plurality of nanowires comprises semiconducting nanowires;
    S2, providing a metal electrode on the surface of the substrate and electrically connected to the plurality of nanowires;
    S3, taking a Scanning Electron Microscope (SEM) image of the plurality of nanowires and the metal electrode, wherein a plurality of light segments is shown in the SEM image, and each of the plurality of light segments corresponds to one of the plurality of nanowires;
    S4, obtain a length distribution by comparing lengths of the plurality of light segments of only the semiconducting nanowires through the SEM image and using the length distribution to represent a bandgap distribution of the semiconducting nanowires, wherein each semiconducting nanowire is longer than a corresponding one of the plurality of light segments.

2. The method as claimed in claim 1, wherein the plurality of nanowires are silicon nanowires, silica nanowires, zinc oxide nanowires, carbon nanotubes, molybdenum disulfide or graphene nanoribbons.

3. The method as claimed in claim 1, wherein the substrate is made of silicon, silica, or quartz.

4. The method as claimed in claim 1, wherein the plurality of nanowires are single-walled carbon nanotubes (SWCNTs).

5. The method as claimed in claim 4, wherein the SWCNTs are synthesized by a method comprising the steps of:
    S11, providing a stable temperature-cut (ST-cut) quartz substrate;
    S12, dispersing an iron catalyst layer on a surface of the ST-cut quartz substrate;
    S13, locating the ST-cut quartz substrate in a quartz tube; and
    S14, introducing methane and hydrogen into the quartz tube at 800 centigrade degrees to 950 centigrade degrees for about 10 minutes to about 20 minutes.

6. The method as claimed in claim 1, wherein the metal electrode is made of titanium, palladium, gold, chromium, aluminum or scandium.

7. The method as claimed in claim 6, wherein the metal electrode is made by an electron beam lithography method comprising the steps of:
S21, locating a first resist layer on the surface of the substrate;
S22, locating a second resist layer on the first resist layer;
S23, forming a required pattern by electron beam lithography; and
S25, removing maintained resist material.

8. The method as claimed in claim 4, wherein the plurality of nanowires are parallel and spaced from each other.

9. The method as claimed in claim 1, wherein, in the SEM image, the plurality of bright segments exists at contact areas between the metal electrode and the plurality of nanowires, and extend along the plurality of nanowires.

10. The method as claimed in claim 1, wherein a bandgap of each of the semiconducting nanowires is inversely proportional to the length of the bright segments of each of the semiconducting nanowires.

11. The method as claimed in claim 1, wherein providing the metal electrode on the surface and electrically connected to the plurality of nanowires comprises providing two metal electrodes substantially parallel to and spaced apart from each other, each of the two metal electrodes is intersected with and contact the plurality of nanowires; and the plurality of light segments of the semiconducting nanowires is discontinuous between the two metal electrodes.

12. A method for evaluating bandgap distributions of single-walled carbon nanotubes (SWCNTs), comprising:
S1, providing a plurality of SWCNTs located on a surface of a substrate, wherein the plurality of SWCNTs comprises semiconducting SWCNTs;
S2, providing a metal electrode on the surface of the substrate and electrically connected to the plurality of SWCNTs;
S3, taking a Scanning Electron Microscope (SEM) image of the plurality of SWCNTs and the metal electrode, wherein a plurality of light segments is shown in the SEM image, and each of the plurality of light segments corresponds to one of the plurality of SWCNTs; and
S4, obtaining a length distribution by comparing lengths of the plurality of light segments of only the semiconducting SWCNTs through the SEM image and using the length distribution to represent a bandgap distribution of the semiconducting SWCNTs, wherein each semiconducting SWCNT is longer than a corresponding one of the plurality of light segments.

13. The method as claimed in claim 12, wherein the SWCNTs are synthesized by a method comprising the steps of:
S11, providing a stable temperature-cut (ST-cut) quartz substrate;
S12, dispersing an iron catalyst layer on a surface of the ST-cut quartz substrate;
S13, locating the ST-cut quartz substrate in a quartz tube; and
S14, introducing methane and hydrogen into the quartz tube at 800 centigrade degrees to 950 centigrade degrees for about 10 minutes to about 20 minutes.

14. The method as claimed in claim 12, wherein the metal electrode is made of titanium, palladium, gold, chromium, aluminum or scandium.

15. The method as claimed in claim 14, wherein the metal electrode is made by an electron beam lithography method comprising the steps of:
S21, locating a first resist layer on the surface of the substrate;
S22, locating a second resist layer on the first resist layer;
S23, forming a required pattern by electron beam lithography; and
S25, removing maintained resist material.

16. The method as claimed in claim 12, wherein the plurality of SWCNTs are parallel and spaced from each other.

17. The method as claimed in claim 16, wherein in the SEM image, the plurality of bright segments exists at contact areas between the metal electrode and the plurality of SWCNTs, and extend along the plurality of SWCNTs.

18. The method as claimed in claim 12, wherein a bandgap of each of the semiconducting SWCNTs is inversely proportional to the length of the bright segments of each of the semiconducting SWCNTs.

19. The method as claimed in claim 12, wherein providing the metal electrode on the surface and electrically connected to the plurality of SWCNTs comprises providing two metal electrodes substantially parallel to and spaced apart from each other, each of the two metal electrodes is intersected with and contact the plurality of SWCNTs; and the plurality of light segments of the semiconducting SWCNTs is discontinuous between the two metal electrodes.

* * * * *